US011670372B2

(12) United States Patent
Chen et al.

(10) Patent No.: US 11,670,372 B2
(45) Date of Patent: *Jun. 6, 2023

(54) PRE-BOOSTING SCHEME DURING A PROGRAM OPERATION IN A MEMORY SUB-SYSTEM

(71) Applicant: Micron Technology, Inc., Boise, ID (US)

(72) Inventors: Hong-Yan Chen, San Jose, CA (US); Yingda Dong, Los Altos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/452,505

(22) Filed: Oct. 27, 2021

(65) Prior Publication Data

US 2022/0051721 A1    Feb. 17, 2022

Related U.S. Application Data

(63) Continuation of application No. 16/910,789, filed on Jun. 24, 2020, now Pat. No. 11,183,245.

(51) Int. Cl.
| | | |
|---|---|---|
| *G11C 11/00* | (2006.01) | |
| *G11C 16/08* | (2006.01) | |
| *G11C 16/04* | (2006.01) | |
| *G11C 16/34* | (2006.01) | |
| *G11C 16/10* | (2006.01) | |
| *G11C 11/56* | (2006.01) | |

(52) U.S. Cl.
CPC .......... *G11C 16/08* (2013.01); *G11C 16/0483* (2013.01); *G11C 16/10* (2013.01); *G11C 16/3459* (2013.01); *G11C 11/5621* (2013.01); *G11C 11/5671* (2013.01)

(58) Field of Classification Search
CPC ..... G11C 16/08; G11C 16/0483; G11C 16/10; G11C 16/3459
See application file for complete search history.

(56) References Cited

U.S. PATENT DOCUMENTS

| | | | |
|---|---|---|---|
| 6,865,118 B2 | 3/2005 | Kwon | |
| 8,929,134 B2 | 1/2015 | Liu et al. | |
| 9,779,820 B1 | 10/2017 | Lee et al. | |
| 11,183,245 B1* | 11/2021 | Chen | G11C 16/08 |
| 2021/0391024 A1* | 12/2021 | Chen | G11C 16/24 |
| 2022/0199175 A1* | 6/2022 | Lu | G11C 16/10 |

* cited by examiner

*Primary Examiner* — Pho M Luu
(74) *Attorney, Agent, or Firm* — Lowenstein Sandler LLP

(57) ABSTRACT

Control logic in a memory device initiates, subsequent to a program verify phase of a program operation, a new program operation on the memory array, the new program operation comprising a pre-boosting phase occurring prior to a program phase. The control logic causing one or more positive pre-boosting voltages to be applied to corresponding subsets of a plurality of word lines of a block of the memory array during the pre-boosting phase and causes the one or more positive pre-boosting voltages to be ramped down to a ground voltage during the pre-boosting phase in a designated order based on a location of the corresponding subsets of the plurality of word lines to which the one or more positive pre-boosting voltages were applied.

20 Claims, 6 Drawing Sheets

PRE-BOOSTING SCHEME DURING A PROGRAM OPERATION IN A MEMORY SUB-SYSTEM

RELATED APPLICATIONS

The application is a continuation of U.S. patent application Ser. No. 16/910,789, filed Jun. 24, 2020, which issued as U.S. Pat. No. 11,183,245 on Nov. 23, 2021, the entire contents of which are hereby incorporated by reference herein.

TECHNICAL FIELD

Embodiments of the disclosure relate generally to memory sub-systems, and more specifically, relate to a pre-boosting scheme during a program operation in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
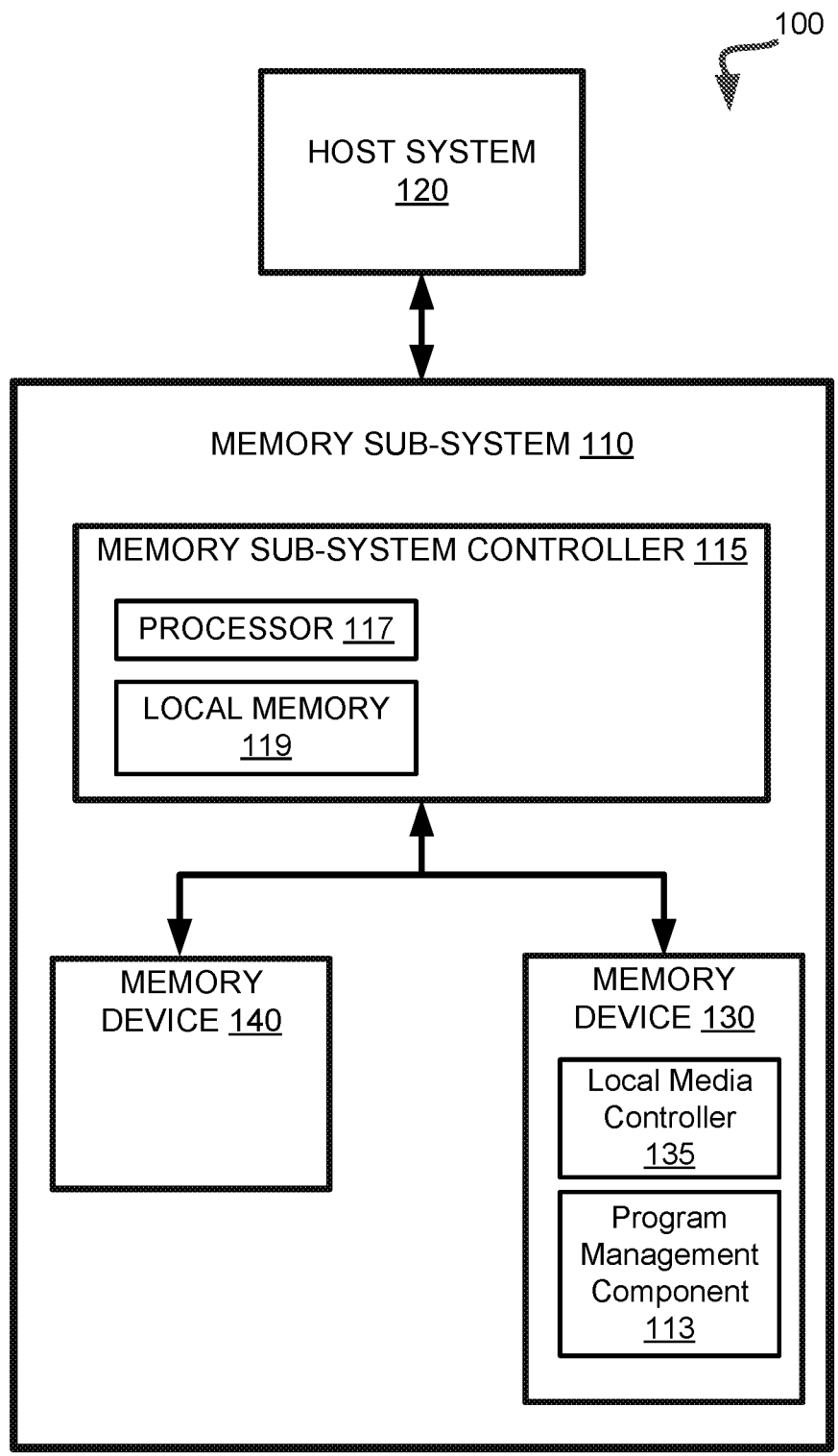
FIG. 1 illustrates an example computing system that includes a memory sub-system in accordance with some embodiments of the present disclosure.

Aspects of the present disclosure are directed to a pre-boosting scheme during a program operation in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more die, each including one or more planes. For some types of non-volatile memory devices (e.g., NAND memory), each plane includes of a set of physical blocks. Each block includes of a set of pages. Each page includes a set of memory cells ("cells"). A cell is an electronic circuit that stores information. A data block hereinafter refers to a unit of the memory device used to store data and can include a group of memory cells, a word line group, a word line, or individual memory cells. Each data block can include a number of sub-blocks, where each sub-block is defined by a set of associated pillars (e.g., vertical conductive traces) extending from a shared bit line. Memory pages (also referred to herein as "pages") store one or more bits of binary data corresponding to data received from the host system. To achieve high density, a string of memory cells in a non-volatile memory device can be constructed to include a number of memory cells at least partially surrounding a pillar of channel material. The memory cells can be coupled to access lines, which are commonly referred to as "word lines," often fabricated in common with the memory cells, so as to form an array of strings in a block of memory. The compact nature of certain non-volatile memory devices, such as 3D flash NAND memory, means word lines are common to many memory cells within a block of memory.

During a programming operation, a selected memory cell(s) can be programmed with the application of a programming voltage to a corresponding selected word line. Due to the word line being common to multiple memory cells, unselected memory cells can be subject to the same programming voltage as the selected memory cell(s). If not otherwise preconditioned, the unselected memory cells can experience effects from the programming voltage on the common word line. These programming voltage effects can include the condition of charge being stored in the unselected memory cells which are expected to maintain stored data. This programming voltage effect is termed a "programming disturbance" or "program disturb" effect. The program disturb effect can render the charge stored in the unselected memory cells unreadable altogether or, although still apparently readable, the contents of the memory cell can be read as a data value different than the intended data value stored before application of the programming voltage.

The presence of residue electrons, such as electrons trapped or otherwise remaining inside the poly-silicon channel of a charge storage structure after an earlier operation (e.g., a previous program operation), can contribute to the program disturb effect. At the end of a program verify operation, for example, a pass voltage (Vpass) applied to the word lines that are not being programmed ramps down and word lines on the source-side having a high threshold voltage will cut off prior to word lines with a lower threshold voltage. Therefore, electrons will be trapped inside the poly-silicon channel at the word lines with the lower threshold voltage (i.e., between the cut off word lines) and become residue electrons. Since the poly-silicon channel (i.e., the pillar channel region) in some non-volatile memory devices is a floating channel that may not be connected to a bulk grounded body, there is generally no path for residual electrons in the channel region to discharge until the entire poly-Si channel reaches a new equilibrium state after some time. These residue electrons can contribute to program disturb in a number of ways. For example, the data word lines can suffer from hot-electron ("hot-e") disturb where a large voltage differential between the gate and source causes the residue electrons to be injected from a drain depletion region into the floating gate. In addition, this voltage differential can initiate an electrostatic field of sufficient magnitude to change the charge on the selected word line and cause the contents of the memory cell to be programmed inadvertently or read incorrectly. Furthermore, the electrostatic field can cause local electron-hole pair generation in the channel region, leading to even more electrons that can be injected into the selected word line.

During a program operation on a non-volatile memory device, certain phases can be encountered, including program, program recovery, program verify, and program verify recovery. Since relatively high voltages are applied during the program and program verify phases, the program recovery and program verify recovery phases allow the device to recover from the high voltage modes to discharge internal nodes, etc. For example, a high program voltage can be applied during a program phase, followed by a program recovery phase where the nodes are discharged. Then a verify voltage can be applied during a program verify phase, followed by a verify recovery phase. During the recovery phases all signals are ramped down to some lower voltage level. Since multiple program operations can be performed in succession, generally, the program verify and program verify recovery phases of a previous program operation are followed by the program phase of a subsequent program operation. The program disturb effects in the memory device are most severe during a program operation when a large number of residue electrons remains on a source-side of the channel from the previous program operation (i.e., the residue electrons were not purged during the program verify recovery phase) and then flow to a drain-side of the channel as program voltages are ramped up during the subsequent program phase.

Aspects of the present disclosure address the above and other deficiencies by implementing a pre-boosting scheme during a program operation on a memory array of a memory device in a memory sub-system. Under certain circumstances, between the program verify phase of one program operation and the seeding phase of a subsequent program operation, control logic in the memory device can initiate a pre-boosting phase. Prior to the pre-boosting phase, the control logic can cause a voltage applied to a word line coupled to a drain-side select gate device in a string of memory cells in a data block of the memory array to be ramped down to a ground voltage at an end of a previous program operation (e.g., a program verify phase) on the memory array after a program verify voltage applied to a number of data word lines is ramped down to the ground voltage. This prevents any voltage present on the bit line from flowing into the channel of the memory string and allows the channel potential at the selected word line (e.g., WLn) to reach 0V prior to the subsequent seeding phase. During the pre-boosting phase, the control logic causes a first positive pre-boosting voltage to be applied to a first set of word lines including the selected word line and any other data word lines on the drain-side (e.g., closer to the bit line) while a ground voltage or a slightly negative voltage is applied to a second set of data word lines further down the memory string. In one embodiment, a second positive pre-boosting voltage having a lower magnitude than the first positive pre-boosting voltage is applied to two or more word lines between the first set and the second set of word lines. This reduces electron barriers at those memory cells coupled to the corresponding word lines and creates a negative channel potential on the source-side of the selected word line (e.g., further away from the bit line) and a positive channel potential on the drain-side allowing any residue electrons previously trapped on the source-side to flow to the drain-side. In one embodiment, the control logic further causes the second positive pre-boosting voltage to be ramped down to a ground voltage during the pre-boosting phase prior to the first positive pre-boosting voltage being ramped down to the ground voltage. This can cause the memory cells coupled to those wordlines to cutoff and prevent the residue electrons now on the drain-side of the selected word line from flowing back to the source-side. At the end of the pre-boosting phase, the seeding phase is initiated and the select gate device is turned on, allowing the residue electrons to be purged from channel of the string via the bit line.

Advantages of the present disclosure include, but are not limited to, improved program performance in the memory sub-system. Since the pre-boosting scheme moves most, if not all, of the residue electrons from the source-side of the selected word line to the drain-side, those electrons can be purged from the channel during the subsequent seeding phase. As a result, when a high program voltage is subsequently applied to the selected word line, the residue electrons are not present and are not injected into the selected word line. Accordingly, program disturb effects in the memory device, such as Fowler-Nordheim tunneling, can be significantly reduced.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or an QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In one embodiment, memory device 130 includes a memory device program management component 113 that can oversee, control, and/or manage data access operations, such as program operations, performed on a non-volatile memory device, such as memory device 130, of memory sub-system 110. A program operation, for example, can include a number of phases, such as a pre-boosting phase, a seeding phase, a program phase, and a program recovery phase. Program management component 113 is responsible for causing certain voltages to be applied (or indicating which voltages to apply) to memory device 130 during the program operation. Prior to the pre-boosting phase, program management component 113 can cause a voltage applied to a word line coupled to a drain-side select gate device in a string of memory cells in a data block of a memory array of memory device 130 to be ramped down to a ground voltage at an end of a previous program operation (e.g., a program verify phase) on the memory array after a program verify voltage applied to a number of data word lines is ramped down to the ground voltage. During the pre-boosting phase, program management component 113 can cause a first positive pre-boosting voltage to be applied to a first plurality of word lines, where each of the first plurality of word lines is coupled to a corresponding memory cell of a first plurality of memory cells in a string of memory cells in the data block. The first plurality of word lines includes a selected word line associated with the program operation. In addition, program management component 113 can cause a second positive pre-boosting voltage to be applied to a second plurality of word lines of the data block during the pre-boosting phase, where the second plurality of word lines is adjacent to the first plurality of wordlines, and where each of the second plurality of word lines is coupled to a corresponding memory cell of a second plurality of memory cells in the string of memory cells. In one embodiment, the second positive pre-booting voltage has a lower magnitude than the first positive pre-boosting voltage. The program management component 113 further causes the second positive pre-boosting voltage to be ramped down to a ground voltage during the pre-boosting phase prior to the first positive pre-boosting voltage being ramped down to the ground voltage. Furthermore, program management component 113 can cause a third pre-boosting voltage to be applied to a third plurality of word lines of the data block during the pre-boosting phase, where the third plurality of word lines is adjacent to the second plurality of wordlines, and where each of the third plurality of word lines is coupled to a corresponding memory cell of a third plurality of memory cells in the string of memory cells. In one embodiment, the third positive pre-booting voltage is at least one of the ground voltage or a negative voltage. Further details with regards to the operations of the program management component 113 are described below.

In some embodiments, the memory sub-system controller 115 includes at least a portion of program management component 113. For example, the memory sub-system controller 115 can include a processor 117 (e.g., a processing device) configured to execute instructions stored in local memory 119 for performing the operations described herein. In some embodiments, program management component 113 is part of the host system 110, an application, or an operating system. In other embodiment, local media controller 135 includes at least a portion of program management component 113 and is configured to perform the functionality described herein. In such an embodiment, program management component 113 can be implemented using hardware or as firmware, stored on memory device 130, executed by the control logic (e.g., program management component 113) to perform the operations related to the pre-boosting scheme described herein.

Figure 2:
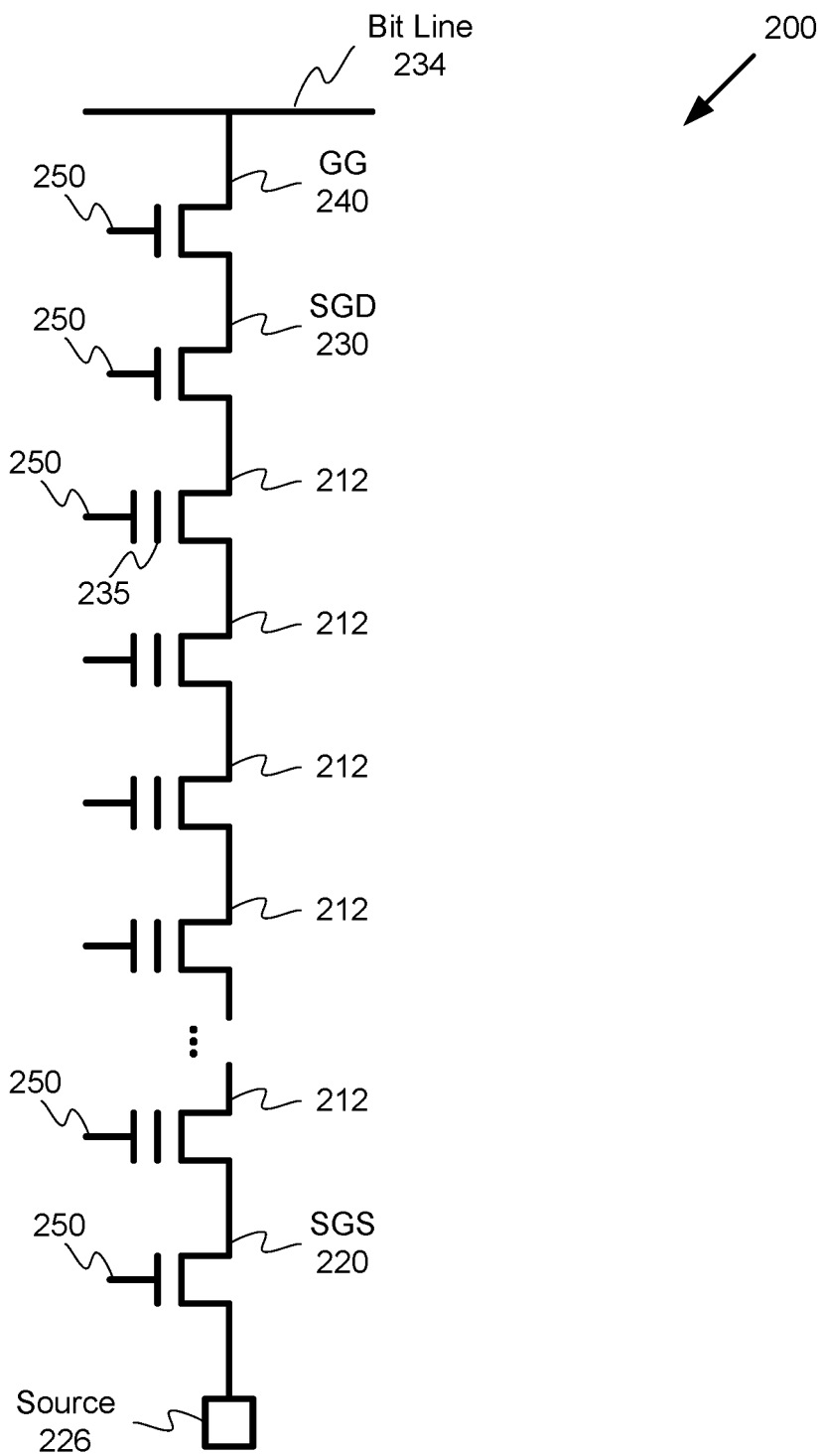
FIG. 2 is a schematic diagram illustrating a string of memory cells in a data block of a memory device in a memory sub-system in accordance with some embodiments of the present disclosure.

FIG. 2 is a schematic diagram illustrating a string 200 of memory cells in a data block of a memory device in a memory sub-system in accordance with some embodiments of the present disclosure. In one embodiment, the string 200 is representative of one portion of memory device 130. The string 200 includes a number of memory cells 212 (i.e., charge storage devices), such as up to 32 memory cells (or more) in some embodiments. The string 200 includes a source-side select transistor known as a source select gate 220 (SGS) (typically an n-channel transistor) coupled between a memory cell 212 at one end of the string 200 and a common source 226. The common source 226 may include, for example, a commonly doped semiconductor material and/or other conductive material. At the other end of the string 200, a drain-side select transistor called a drain select gate 230 (SGD) (typically an n-channel transistor) and a gate induced drain leakage (GIDL) generator 240 (GG) (typically an n-channel transistor) are coupled between one of the memory cells 212 and a data line 234, which is commonly referred to in the art as a "bit line." The common source 226 can be coupled to a reference voltage (e.g., ground voltage or simply "ground" [Gnd]) or a voltage source (e.g., a charge pump circuit or power supply which may be selectively configured to a particular voltage suitable for optimizing a programming operation, for example).

Each memory cell 212 may include, for example, a floating gate transistor or a charge trap transistor and may comprise a single level memory cell or a multilevel memory cell. The floating gate may be referred to as a charge storage structure 235. The memory cells 212, the source select gate 220, the drain select gate 230, and the GIDL generator 240 can be controlled by signals on their respective control gates 250.

The control signals can be applied by program management component 113, or at the direction of program management component 113, to select lines (not shown) to select strings, or to access lines (not shown) to select memory cells 212, for example. In some cases, the control gates can form a portion of the select lines (for select devices) or access lines (for cells). The drain select gate 230 receives a voltage that can cause the drain select gate 230 to select or deselect the string 200. In one embodiment, each respective control gate 250 is connected to a separate word line (i.e., access line), such that each device or memory cell can be separately controlled. The string 200 can be one of multiple strings of memory cells in a block of memory cells in memory device 130. For example, when multiple strings of memory cells are present, each memory cell 212 in string 200 may be connected to a corresponding shared word line, to which a corresponding memory cell in each of the multiple strings is also connected. As such, if a selected memory cell in one of those multiple strings is being programmed, a corresponding unselected memory cell 212 in string 200 which is connected to the same word line as the selected cell can be subjected to the same programming voltage, potentially leading to program disturb effects. Accordingly, in one embodiment, program management component 113 causes a word line driver to apply a first positive pre-boosting voltage to be applied to a first plurality of word lines during the pre-boosting phase, wherein each of the first plurality of word lines is coupled to a control gate 250 of a corresponding memory cell 212 in string 200, including a selected word line associated with the program operation. Program management component 113 further causes a second positive pre-boosting voltage to be applied to a second plurality of word lines during the pre-boosting phase, wherein the second plurality of word lines is adjacent to the first plurality of wordlines, wherein each of the second plurality of word lines is coupled to a control gate of a corresponding memory cell 212 in the string 200, and wherein the second positive pre-booting voltage has a lower magnitude than the first positive pre-boosting voltage, to actively push the residue electrons from the source-side to the drain-side. Program management component 113 further causes the second positive pre-boosting voltage to be ramped down to a ground voltage during the pre-boosting phase prior to the first positive pre-boosting voltage being ramped down to the ground voltage, to keep the residue electrons on the drain-side. As a result, most, if not all, of the residue electrons can be purged from channel of the string during the seeding phase, such that when a high program voltage is subsequently applied to the selected word line, the residue electrons are not present and are not injected be injected into the selected word line.

Figure 3:
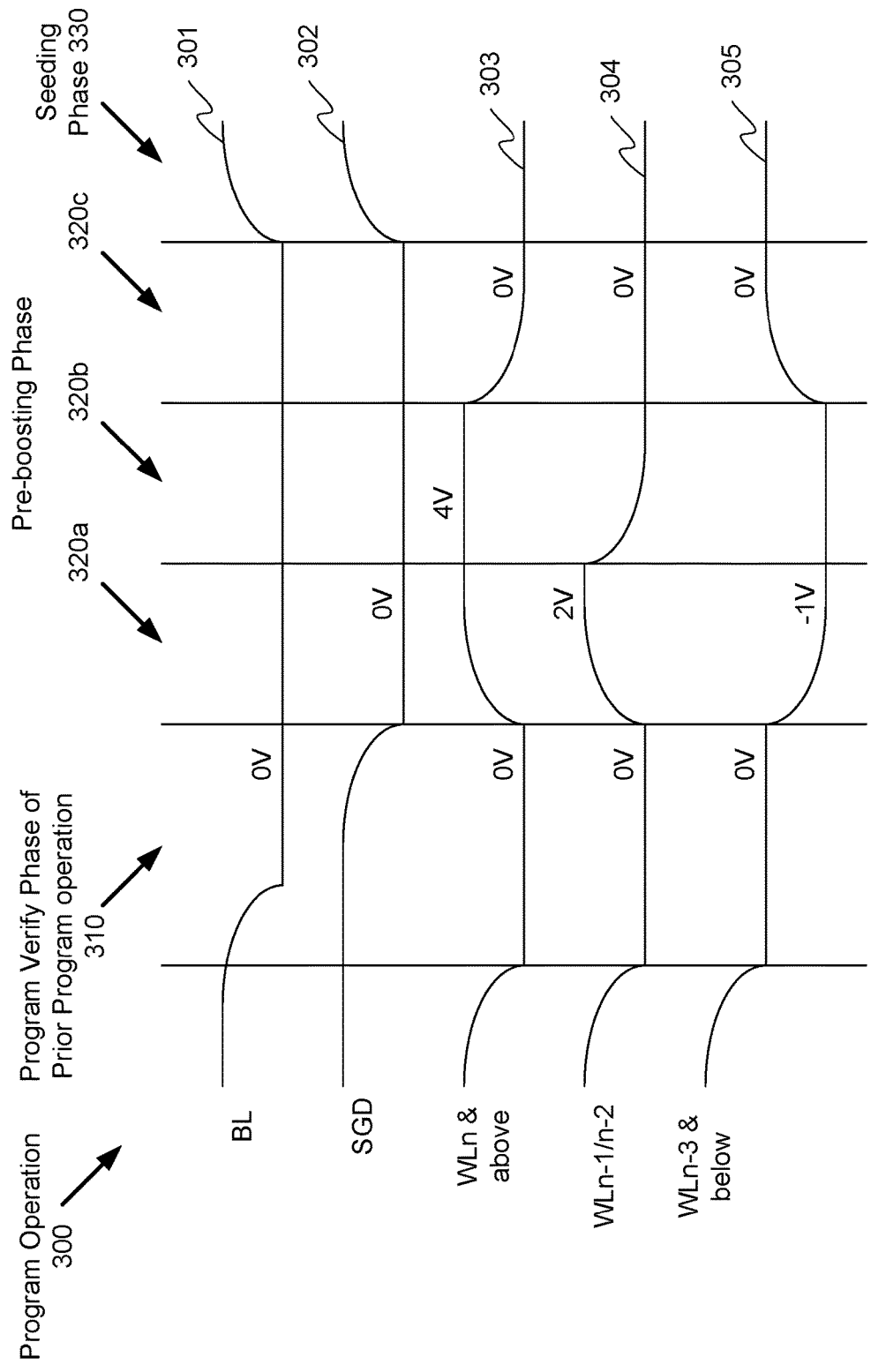
FIG. 3 is a timing diagram for operation of a memory device during a program operation, in accordance with some embodiments of the present disclosure.

FIG. 3 is a timing diagram 300 for operation of a memory device during a program operation, in accordance with some embodiments of the present disclosure. During a programming operation performed on a non-volatile memory device, such as memory device 130, certain phases can be encountered, including a program verify phase 310 of a prior program operation, a pre-boosting phase 320a, 320b, and 320c, and a seeding phase 330. The program operation can also include other phases which are not illustrated in timing diagram 300, such as a program phase, or various recovery phases, for example. Timing diagram 300 illustrates the various phases of a program operation 300, according to one embodiment. In this embodiment, different signals are applied to various devices in memory device 130 in each of the illustrated phases. In one embodiment, program management component 113 sends a signal to a corresponding driver (or some other component) instructing that driver to apply the associated signals.

During the program verify phase 310, a program verify voltage is applied to the word lines (e.g., selected word line WLn) to read the level of charge stored at the selected memory cells to confirm that the desired value was properly programmed during the prior program operation. In addition, signal 301 representing a bit line voltage is applied to the bit line (BL) and a signal 302 is applied to the drain-side select gate device SGD 230. Signal 302 (e.g., 7V) activates the drain-side select gate device 230 (e.g., turns it "on") thereby allowing the bit line voltage to flow from bit line 234 through the drain-side select gate device 230 to the various data word lines connected to string 200. In one embodiment, the data word lines include one or more word lines connected to the remaining memory cell(s) 212 of string 200. These cells 212 are generally used for storing data, such as data from host system 120. In one embodiment, program management component 113 can cause the signal 302 applied to the word line coupled to the drain-side select gate device SGD in the string 200 to be ramped down to a ground voltage (e.g., 0V) at an end of the previous program operation 310 after signal 303 representing a program verify voltage applied to the first plurality of word lines (i.e., WLn and above) and the second plurality of wordlines (i.e., WLn–1 and WLn–2) is ramped down to the ground voltage. This prevents any voltage present on the bit line from flowing into the channel of the memory string 200 and allows the channel potential at the selected word line (e.g., WLn) to reach 0V prior to the subsequent seeding phase 330. Signal 301 and signal 302 remain at a ground voltage during pre-boosting phase 320a, 320b, 320c.

In one embodiment, during pre-boosting phase 320a, program management component 113 causes signal 303 having a first positive pre-boosting voltage (e.g., 4V) to be applied to a first plurality of word lines (e.g., WLn and above), including a selected word line associated with the program operation. In one embodiment, the first plurality of word liens includes the selected word line WLn and all of the word lines (e.g., data word lines or dummy word lines) on the drain-side of the selected word line. This can include any word lines between the selected word line and the bit line 234 in memory string 200. In another embodiment, the first positive pre-boosting voltage is applied only to a threshold number of word lines (e.g., 5 word lines, 10 word lines, etc.). Any additional word lines on the drain-side of the selected word line can receive a ground voltage instead.

In addition, program management component 113 causes signal 304 having a second positive pre-boosting voltage (e.g., 2V) to be applied to a second plurality of word lines (e.g., WLn–1 and WLn–2), which are adjacent to the first plurality of wordlines. Although different values may be used in different implementations, the second positive pre-booting voltage generally has a lower magnitude than the first positive pre-boosting voltage. This makes the channel potential gradient from the source-side to the drain-side less severe, thereby preventing any electron injection during the pre-boosting phase 320a. In one embodiment, the same pre-boosting voltage is applied to both WLn–1 and WLn–2. In another embodiment, different voltages are applied to WLn–1 (e.g., 2V) and WLn–2 (e.g., 1V). In one embodiment, the second plurality of word lines may include more than two word lines.

In one embodiment, during pre-boosting phase 320a, program management component 113 further causes signal 305 having third pre-boosting voltage (e.g., –1V) to be applied to a third plurality of word lines (e.g., WLn−3 and below), which are adjacent to the second plurality of wordlines. Depending on the embodiment, the third positive pre-booting voltage can be at least one of a ground voltage or a negative voltage. This creates a negative channel potential on the source-side of the selected word line and a positive channel potential on the drain-side allowing any residue electrons previously trapped on the source-side to flow to the drain-side. In one embodiment, during pre-boosting phase 320b, program management component 113 causes signal 304 having the second positive pre-boosting voltage to be ramped down to a ground voltage (e.g., 0V) prior to the first positive pre-boosting voltage being ramped down. Thus, signal 303 remains at the first positive pre-boosting voltage during pre-boosting phase 320b. This can cause the memory cells coupled to WLn−1 and WLn−2 to cutoff and prevent the residue electrons now on the drain-side of the selected word line from flowing back to the source-side.

In one embodiment, during pre-boosting phase 320c, program management component 113 causes signal 303 having the first positive pre-boosting voltage to be ramped down to a ground voltage, and signal 305 having a negative voltage to ramp up to the ground voltage. In another embodiment, signal 305 remains at the ground voltage throughout pre-boosting phase 320a, 320b, 320c.

During the seeding phase 330, program management component 113 causes signal 301 having a seeding voltage (e.g., 3 volts) to be applied to the bit line 234 of the string 200. In one embodiment, program management component 113 sends a signal to the bit line driver (or some other component) instructing that driver to apply signal 301 to the bit line 234. In one embodiment, program management component 113 causes signal 302 having a positive voltage to be applied to the drain-side select gate device 230 during the seeding phase 330 and signals 303, 304, and 305, each having a ground voltage, to be applied to the corresponding word lines. When the select gate device is activated during the seeding phase 330, the residue electrons now on the drain-side of the selected word line can flow out of the channel via the bit line.

Figure 4:
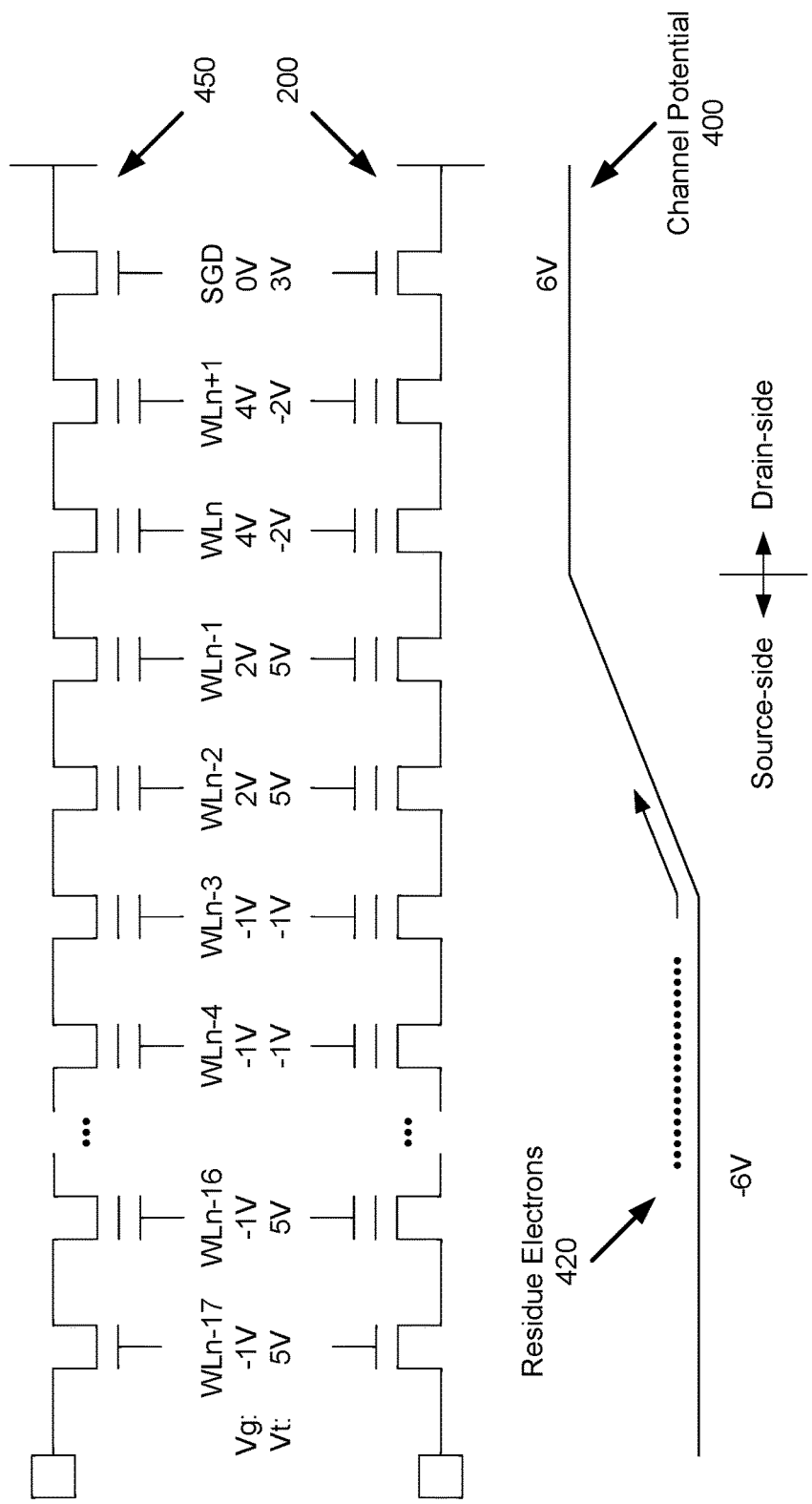
FIG. 4 is a diagram illustrating the channel potential for a string of memory cells during a pre-boosting phase of a program operation, in accordance with some embodiments of the present disclosure.

FIG. 4 is a diagram illustrating the channel potential 400 for a string of memory cells during a pre-boosting phase of a program operation, in accordance with some embodiments of the present disclosure. In one embodiment, the string 200 corresponds to string 200 illustrated in FIG. 2 and the seeding scheme used corresponds to timing diagram 300 illustrated in FIG. 3. As described above, the string 200 includes a GIDL generator (GG) device, a drain select gate (SGD) device, a number of memory cells, each connected to a separate word line (WL), and a source select gate (SGS) device. In one embodiment, one or more of the memory cells are connected to a dummy word line (DWL) and are generally not used for storing data. A least one of the memory cells in string 200 can be connected to a selected word line (i.e., the word line being programmed (WLn)) and each remaining memory cell on the source-side of the selected word line can be connected to word lines referred to as data word lines (WLn−1, WLn−2, ... WLn−17). In one embodiment, there can be one or more memory cells on the drain-side of the selected word line connected to word lines (e.g., WLn+1), which can be either dummy word lines or data word lines. Depending on the embodiment, there can be any number of data word lines. In one embodiment, string 200 represents an unselected sub-block of a data block of memory cells of memory device 130. As described above, the data block can include additional sub-blocks having additional strings of memory cells. For example, string 450 can represent a selected sub-block of the same data block, and can similarly include a number of memory cells and/or other devices which are coupled to the same word lines as the corresponding memory cells and/or other devices of string 200.

In one embodiment, each of the devices in string 200 has an associated threshold voltage (Vt) which represents a voltage at which each device switches from an "off" state to an "on" state, or vice versa. For example, SGD can have a threshold voltage of 3V, the memory cells connected to the WLn+1 and the selected word line WLn can have a threshold voltage of −2V, the memory cell connected to WLn−1 and WLn−2 can have a threshold voltage of 5V, the memory cells connected to WLn−3 through WLn−15 can have a threshold voltage of −1V, and the memory cells connected to WLn−16 and WLn−17 can have a threshold voltage of 5V. In one embodiment, the channel potential 400 of the string 200 represents a difference between a voltage applied at the control gate of each device (i.e., a gate voltage (Vg)) and a representative threshold voltage. In one embodiment, there is a first representative threshold voltage on the drain-side of the selected word line (WLn) and a second representative threshold voltage on the source-side of the selected word line (WLn). Each representative threshold voltage can be the highest threshold voltage on the drain-side and the source-side, respectively. Thus, in the illustrated embodiment, the first representative threshold voltage on the drain-side can be the −2V associated with the selected word line WLn and WLn+1 (excluding the SGD) and the second representative threshold voltage on the source-side can be the 5V associated with the memory devices connected to WLn−1, WLn−2, WLn−16 and WLn−17. Since WLn−1 has the highest threshold voltage on the source-side of the selected word line, the highest number of source-side residue electrons are trapped there. This represents the worst case scenario in terms of program disturb effect, so the corresponding threshold voltage can be used as the representative threshold voltage.

As described above with respect to FIG. 3, in one embodiment, program management component 113 can cause different voltage signals to be applied to the gate terminal of different devices during the pre-boosting phase of a program operation. These voltage signals can be referred to as a respective gate voltage (Vg). As illustrated in FIG. 4, in one embodiment, program management component 113 can cause a first positive pre-boosting voltage to be applied to a first plurality of word lines of the string 200, where the positive voltage can be seen at the control gates 250 of the corresponding memory cells 212. For example, program management component 113 can cause a first positive pre-boosting voltage (e.g., 4V) to be applied to the selected word line (i.e., WLn) and any word lines above the selected word line in the string (e.g., WLn+1), and can cause a second positive pre-boosting voltage (e.g., 2V) to be applied to a second plurality of word lines of the data block during the pre-boosting phase adjacent to the first plurality of word lines on the source-side (e.g., WLn−1 and WLn−2). These positive voltages can reduce electron barriers at the corresponding memory cells, allowing any residue electrons 420 trapped on the source-side to flow past the barriers and to the drain (i.e., bit line 234). In addition, program management component 113 can cause a third pre-boosting voltage to be applied to a third plurality of word lines of the string 200 during the pre-boosting phase. For example, program management component 113 can cause the negative voltage (e.g., −1V) to be applied to word lines WLn−3 through WLn−17. This negative voltage can actively push the residue electrons 420 from the source-side to the drain-side.

As a result, the channel potential 400 on the drain-side of the selected word line (WLn) is 6V (i.e., a gate voltage of 4V minus the first representative threshold voltage of −2V) and the channel potential 400 on the source-side of the selected word line (WLn) is −6V (i.e., a gate voltage of −1V minus the second representative threshold voltage of 5V). Thus, the differential in the channel potential 400 from the drain-side to the source-side is −12V. Note that if a ground voltage (0V) were applied on the word lines, the drain-side channel potential would be 2V, the source-side channel potential would be −5V and the differential would be only −7V. Thus, applying the positive voltage to certain word lines and the negative voltage to other word lines increases the potential gradient between the drain-side and the source-side of the selected word line (WLn). Since the source-side of the selected word line (WLn) has a lower channel potential, the residue electrons 420 trapped on the source-side tend to flow toward the drain-side during the pre-boosting phase, and past the lowered barrier at WLn−1 and WLn−2, where they can be purged via the bit line 234 once SGD is activated during the seeding phase. Under the worst case pattern, the electron barrier on WLn−1 and WLn−2 seen by residue electrons 420 is 5V in a conventional seeding scheme and can be reduced to less than 2V using the techniques described herein. This indicates that more than 60% of residue electrons can be purged during the seeding phase, and thus, that the program disturb from hot-electron injection during the program phase can also be expected to reduce by approximately 60%.

Figure 5:
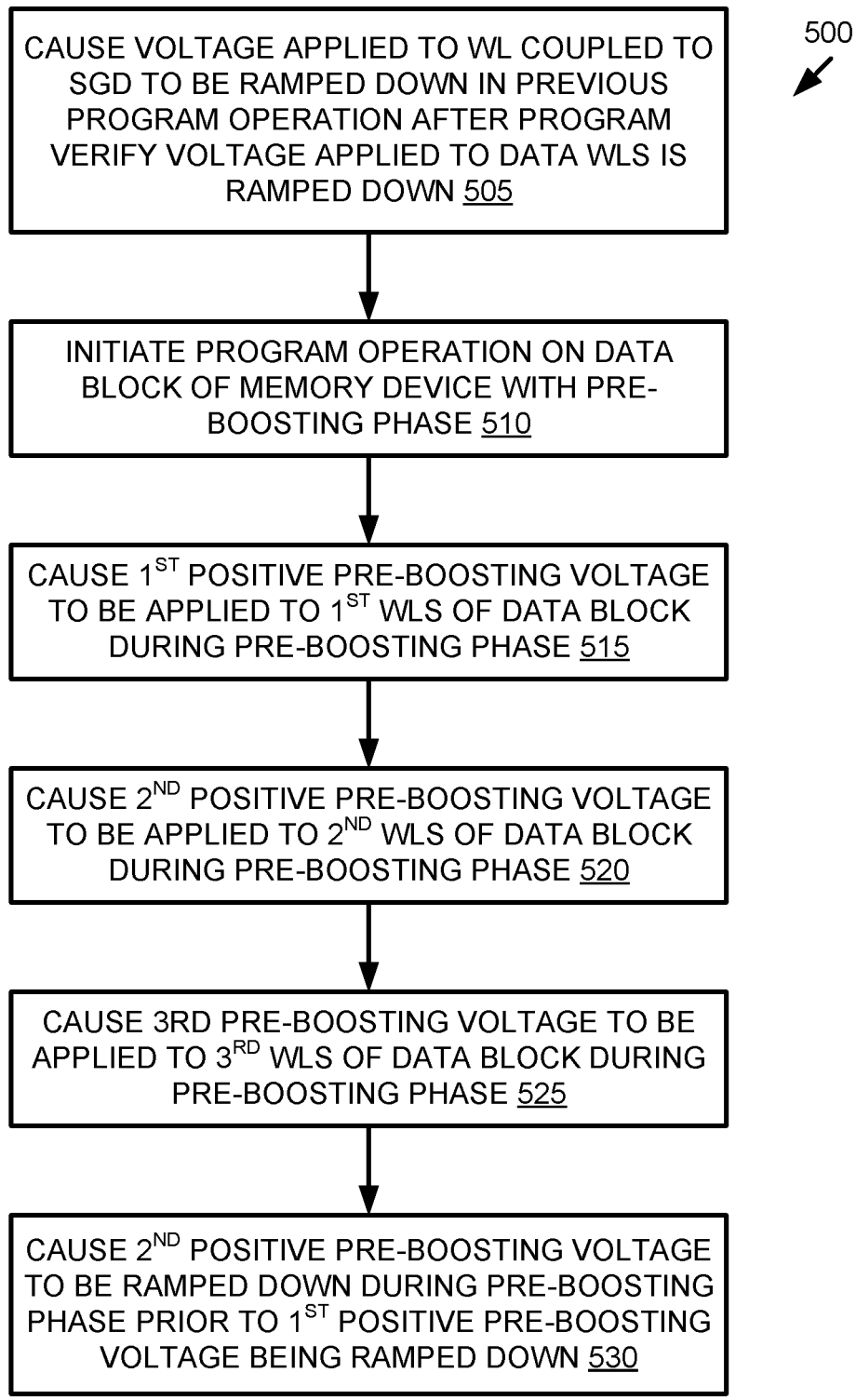
FIG. 5 is a flow diagram of an example method of implementing a pre-boosting scheme during a program operation in a memory sub-system, in accordance with some embodiments of the present disclosure.

FIG. 5 is a flow diagram of an example method of implementing a pre-boosting scheme during a program operation in a memory sub-system, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by program management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, a previous program operation is concluded. For example, at the end of the previous program operation, once the program verify phase occurs, where the results of the previous program operation are confirmed (e.g., read), the processing logic can ramp down the various voltages applied to the word lines of memory string 200 in anticipation of a subsequent program operation beginning. In one embodiment, the processing logic causes a voltage applied to a word line coupled to a drain-side select gate device (SGD) in the string 200 of memory cells 212 to be ramped down to a ground voltage (e.g., 0V) at an end of the previous program operation after a program verify voltage applied to a first plurality of word lines (e.g., WLn and WLn+1) and the second plurality of wordlines (e.g., WLn−1 and WLn−2) is ramped down to the ground voltage.

At operation 510, the subsequent program operation is initiated. For example, the processing logic (e.g. processor 117 or local media controller 135) can initiate a program operation on a memory device (e.g., memory device 130). In one embodiment, the program operation includes a pre-boosting phase, a seeding phase, a program phase, and program verify phase. In certain embodiments, each of these phases can be repeated numerous times in a cycle during a single programming operation. The seeding phase generally includes global boosting of channel voltages of inhibited strings in the memory device 130 in an attempt to counteract program disturb resulting from the use of high voltage program pulses. During the program phase, a program voltage is applied to selected word lines (e.g., WLn) of the memory device 130, in order to program a certain level of charge to the selected memory cells on the word lines representative of a desired value. During the program verify phase, a program verify voltage is applied to the selected word lines in order to read the level of charge programmed during the program phase and to verify that it is correct. Prior to those phases, however, the pre-boosting phase can be performed, as described below.

At operation 515, a first positive pre-boosting voltage is applied to certain word lines. For example, the processing logic can cause a first positive pre-boosting voltage to a first plurality of word lines of a data block of the memory array during the pre-boosting phase, wherein each of the first plurality of word lines is coupled to a corresponding memory cell of a first plurality of memory cells in a string of memory cells in the data block, the first plurality of word lines comprising a selected word line associated with the program operation. In one embodiment, program management component 113 can cause the first positive pre-boosting voltage (e.g., 4V) to be applied to certain word lines (e.g., WLn and WLn+1) of the string 200 during the pre-boosting phase 320a, where the voltage can be seen at the control gates 250 of the corresponding memory cells 212. The first positive pre-boosting voltage can create a positive channel potential on the drain-side of the selected word line.

At operation 520, a second positive pre-boosting voltage is applied to certain word lines. For example, the processing logic can cause a second positive pre-boosting voltage to be applied to a second plurality of word lines of the data block during the pre-boosting phase, wherein the second plurality of word lines is adjacent to the first plurality of wordlines, wherein each of the second plurality of word lines is coupled to a corresponding memory cell of a second plurality of memory cells in the string of memory cells, and wherein the second positive pre-booting voltage has a lower magnitude than the first positive pre-boosting voltage. In one embodiment, program management component 113 can cause the second positive pre-boosting voltage (e.g., 2V) to be applied to certain word lines (e.g., WLn−1 and WLn−2) of the string 200 during the pre-boosting phase 320a, where the voltage can be seen at the control gates 250 of the corresponding memory cells 212. The second positive pre-boosting voltage can reduce electron barriers at those certain word lines, allowing any residue electrons trapped on the source-side to flow past the barriers and to the drain (i.e., bit line 234). In general, the second positive pre-boosting voltage is less than the first positive pre-boosting voltage. For example, in the embodiment illustrated in timing diagram 300, the second positive pre-boosting voltage is 2V.

At operation 525, a negative voltage or a ground voltage is applied to other word lines. For example, the processing logic can cause a third pre-boosting voltage to be applied to a third plurality of word lines of the data block during the pre-boosting phase, wherein the third plurality of word lines is adjacent to the second plurality of wordlines, wherein each of the third plurality of word lines is coupled to a corresponding memory cell of a third plurality of memory cells in the string of memory cells, and wherein the third positive pre-booting voltage comprises at least one of the ground voltage or a negative voltage. For example, in the embodiment illustrated in timing diagram 300, program management component 113 causes a negative voltage (e.g., −1V) to be applied to WLn−3 through WLn−17. In other embodiments, program management component 113 causes a ground voltage (i.e., 0V) to be applied to WLn−3 through WLn−17. This negative voltage or ground voltage can create a negative channel potential on the source-side of the selected word line can actively push the residue electrons from the source-side to the drain-side.

At operation 530, the pre-boosting voltages are ramped down. For example, the processing logic can cause the second positive pre-boosting voltage to be ramped down to a ground voltage during the pre-boosting phase prior to the first positive pre-boosting voltage being ramped down to the ground voltage. In one embodiment, program management component 113 causes the second positive pre-boosting voltage to be ramped down during pre-boosting phase 320b, while the first positive pre-boosting voltage is not ramped down until pre-boosting phase 320c. This can cause the memory cells 212 coupled to word lines WLn−1 and WLn−2 to cutoff and prevent the residue electrons 420 now on the drain-side of the selected word line WLn from flowing back to the source-side. At the end of the pre-boosting phase 320c, the seeding phase 330 is initiated and the select gate device (e.g., SGD) is turned on, allowing the residue electrons 420 to be purged from channel of the string via the bit line 234.

In one embodiment, program management component 113 can selectively implement the pre-boosting phase described above only in certain situations. Otherwise, the subsequent program operation can begin with the seeding phase, without the pre-boosting phase having occurred. Thus, program management component 113 can perform the pre-boosting phase only during certain program operations or during certain iterations of a single program operation. For example, a program operation might include a plurality of seeding phases, program phases and program verify phases, which are repeated in sequence. In one embodiment, the pre-boosting phase is implemented only prior to a subset of the plurality of seeding phases occurring after a threshold number of the plurality of program phases have occurred. For example, if the threshold value was four, the pre-boosting phase would not occur prior to the first four seeding phases, but would occur prior to any seeding phases after that. In another embodiment, if the total number of seeding phases to be performed is known in advance, program management component 113 might cause the pre-boosting phase to be performed only during the law few seeding phases (e.g., during the last five seeding phases).

Figure 6:
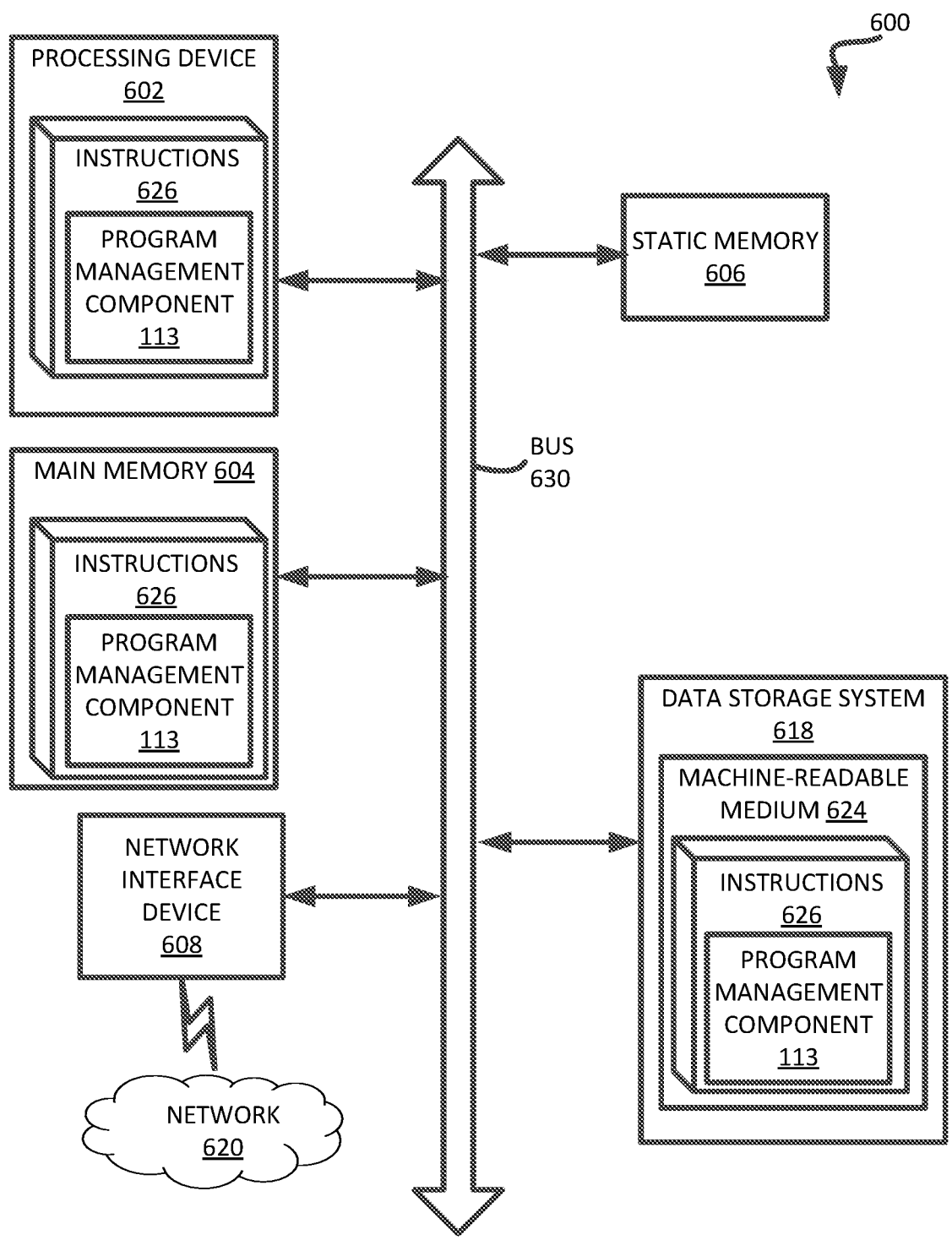
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the program management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium, such as a non-transitory computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to the program management component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
    a memory array; and
    control logic, operatively coupled with the memory array, to perform operations comprising:
        initiating, subsequent to a program verify phase of a program operation, a new program operation on the memory array, the new program operation comprising a pre-boosting phase occurring prior to a program phase;
        causing one or more positive pre-boosting voltages to be applied to corresponding subsets of a plurality of word lines of a block of the memory array during the pre-boosting phase; and
        causing the one or more positive pre-boosting voltages to be ramped down to a ground voltage during the pre-boosting phase in a designated order based on a location of the corresponding subsets of the plurality of word lines to which the one or more positive pre-boosting voltages were applied.

2. The memory device of claim 1, wherein the plurality of word lines comprises a selected word line associated with the new program operation, wherein the selected word line is coupled to a first memory cell of a string of memory cells in the block, and wherein causing the one or more positive pre-boosting voltages to be applied to the corresponding subsets of the plurality of word lines comprises:
    causing a first positive pre-boosting voltage to be applied to a first subset of the plurality of word lines coupled to memory cells on a drain-side of the first memory cell in the string of memory cells.

3. The memory device of claim 2, wherein the first subset of the plurality of wordlines comprises one or more wordlines coupled to a threshold number of memory cells on the drain-side of the first memory cell in the string of memory cells.

4. The memory device of claim 2, wherein causing the one or more positive pre-boosting voltage to be applied to the corresponding subsets of the plurality of word lines comprises:
    causing a second positive pre-boosting voltage to be applied to a second subset of the plurality of word lines coupled to memory cells on a source-side of the first memory cells in the string of memory cells.

5. The memory device of claim 4, wherein the control logic to perform further operations comprising:
    causing a plurality of positive pre-boosting voltages to be applied to the second subset of the plurality of word lines, each of the plurality of positive pre-boosting voltages having a different magnitude.

6. The memory device of claim 1, wherein the control logic to perform further operations comprising:
    causing a voltage applied to a word line coupled to a drain-side select gate device in a string of memory cells in the block to be ramped down to a ground voltage at an end of the program operation on the memory array after a program verify voltage applied to the corresponding subsets of the plurality of word lines is ramped down to the ground voltage.

7. The memory device of claim 4, wherein the control logic to perform further operations comprising:—
causing a third pre-boosting voltage to be applied to a third subset of the plurality of word lines of the block during the pre-boosting phase, wherein the third subset of the plurality of word lines is adjacent to the second subset of the plurality of wordlines, wherein each word line of the third subset of the plurality of word lines is coupled to a corresponding memory cell in the string of memory cells, and wherein the third pre-boosting voltage comprises at least one of the ground voltage or a negative voltage.

8. The memory device of claim 1, wherein the new program operation comprises a plurality of program phases, and wherein the control logic is to initiate the pre-boosting phase prior to only a subset of the plurality of program phases occurring after a threshold number of the plurality of program phases have occurred.

9. A method comprising:
initiating, subsequent to a program verify phase of a program operation, a new program operation on a memory array, the new program operation comprising a pre-boosting phase occurring prior to a program phase;
causing one or more positive pre-boosting voltages to be applied to corresponding subsets of a plurality of word lines of a block of the memory array during the pre-boosting phase; and
causing the one or more positive pre-boosting voltages to be ramped down to a ground voltage during the pre-boosting phase in a designated order based on a location of the corresponding subsets of the plurality of word lines to which the one or more positive pre-boosting voltages were applied.

10. The method of claim 9, wherein the plurality of word lines comprises a selected word line associated with the new program operation, wherein the selected word line is coupled to a first memory cell of a string of memory cells in the block, and wherein causing the one or more positive pre-boosting voltages to be applied to the corresponding subsets of the plurality of word lines comprises:
causing a first positive pre-boosting voltage to be applied to a first subset of the plurality of word lines coupled to memory cells on a drain-side of the first memory cell in the string of memory cells.

11. The method of claim 10, wherein the first subset of the plurality of wordlines comprises one or more wordlines coupled to a threshold number of memory cells on the drain-side of the first memory cell in the string of memory cells.

12. The method of claim 10, wherein causing the one or more positive pre-boosting voltage to be applied to the corresponding subsets of the plurality of word lines comprises:
causing a second positive pre-boosting voltage to be applied to a second subset of the plurality of word lines coupled to memory cells on a source-side of the first memory cells in the string of memory cells.

13. The method of claim 12, further comprising:
causing a plurality of positive pre-boosting voltages to be applied to the second subset of the plurality of word lines, each of the plurality of positive pre-boosting voltages having a different magnitude.

14. The method of claim 9, further comprising:
causing a voltage applied to a word line coupled to a drain-side select gate device in a string of memory cells in the block to be ramped down to a ground voltage at an end of the program operation on the memory array after a program verify voltage applied to the corresponding subsets of the plurality of word lines is ramped down to the ground voltage.

15. The method of claim 12, further comprising:—
causing a third pre-boosting voltage to be applied to a third subset of the plurality of word lines of the block during the pre-boosting phase, wherein the third subset of the plurality of word lines is adjacent to the second subset of the plurality of wordlines, wherein each word line of the third subset of the plurality of word lines is coupled to a corresponding memory cell in the string of memory cells, and wherein the third pre-boosting voltage comprises at least one of the ground voltage or a negative voltage.

16. The method of claim 9, wherein the new program operation comprises a plurality of program phases, and wherein the control logic is to initiate the pre-boosting phase prior to only a subset of the plurality of program phases occurring after a threshold number of the plurality of program phases have occurred.

17. A memory device comprising:
a first string of memory cells in a selected sub-block of a block of memory cells, wherein the first string of memory cells comprises a first plurality of memory cells coupled to a plurality of word lines; and
a second string of memory cells in an unselected sub-block of the block of memory cells, wherein the second string of memory cells comprises a second plurality of memory cells coupled to the plurality of word lines,
wherein corresponding subsets of the plurality of word lines are configured to receive one or more positive pre-boosting voltage signals during a pre-boosting phase of a program operation performed on the selected sub-block, and
wherein the one or more positive pre-boosting voltage signals are to be ramped down to a ground voltage during the pre-boosting phase in a designated order based on a location of the corresponding subsets of the plurality of word lines to which the one or more positive pre-boosting voltage signals were applied.

18. The memory device of claim 17, wherein the plurality of word lines comprises a selected word line associated with the program operation, wherein the selected word line is coupled to a first memory cell of the second string of memory cells in the block, wherein a first subset of the plurality of word lines is configured to receive a first positive pre-boosting voltage signal, and wherein the first subset of the plurality of wordlines is coupled to one or more memory cells on a drain-side of the first memory cell in the second string of memory cells.

19. The memory device of claim 18, wherein a second subset of the plurality of word lines is configured to receive a second positive pre-boosting voltage signal, and wherein the second subset of the plurality of word lines is coupled to the two or more memory cells on a source-side of the first memory cell in the second string of memory cells.

20. The memory device of claim 17, wherein the second string of memory cells comprises a drain-side select gate device coupled to a word line configured to receive a voltage signal that is ramped down to a ground voltage at an end of a previous program operation after a program verify voltage applied to the corresponding subsets of the plurality of word lines is ramped down to the ground voltage.

* * * * *